(12) United States Patent
Jeon et al.

(10) Patent No.: US 10,338,124 B2
(45) Date of Patent: Jul. 2, 2019

(54) CABLE FAULT DIAGNOSIS METHOD AND SYSTEM

(71) Applicant: KOREA ELECTRICAL SAFETY CORPORATION, Jeollabuk-do (KR)

(72) Inventors: Jeong-chay Jeon, Jeonju-si (KR); Jae-jin Kim, Jeonju-si (KR); Myeong-il Choi, Jeonju-si (KR); Taek-hee Kim, Jeollabuk-do (KR)

(73) Assignee: Korea Electrical Safety Corporation, Jeollabuk-do (KR)

( * ) Notice: Subject to any disclaimer, the term of this patent is extended or adjusted under 35 U.S.C. 154(b) by 191 days.

(21) Appl. No.: 15/118,108

(22) PCT Filed: May 7, 2015

(86) PCT No.: PCT/KR2015/004571
§ 371 (c)(1),
(2) Date: Aug. 11, 2016

(87) PCT Pub. No.: WO2016/178447
PCT Pub. Date: Nov. 10, 2016

(65) Prior Publication Data
US 2017/0199235 A1 Jul. 13, 2017

(30) Foreign Application Priority Data
May 7, 2015 (KR) .................. 10-2015-0064025

(51) Int. Cl.
*G01R 31/02* (2006.01)
*G01R 31/11* (2006.01)

(52) U.S. Cl.
CPC ............ *G01R 31/021* (2013.01); *G01R 31/11* (2013.01)

(58) Field of Classification Search
None
See application file for complete search history.

(56) References Cited

U.S. PATENT DOCUMENTS

| 6,714,021 B2 | 3/2004 | Williams |
| 7,337,079 B2 | 2/2008 | Park et al. |

(Continued)

FOREIGN PATENT DOCUMENTS

| KR | 10-2002-0039409 A | 5/2002 |
| KR | 10-2004-0005288 A | 1/2004 |

OTHER PUBLICATIONS

Jeong-Chay Jeon et al., "Fault Detection of Low Voltage Cable using Time-Frequency Correlation in SSTDR", The Transactions of the Korean Institute of Electrical Engineers, 2015, pp. 498-504, vol. 64, No. 3.

*Primary Examiner* — Jermele M Hollington
*Assistant Examiner* — Suresh K Rajaputra
(74) *Attorney, Agent, or Firm* — Rabin & Berdo, P.C.

(57) ABSTRACT

Disclosed herein is a cable fault diagnosis system and method, wherein when an application signal and a reflected signal overlap each other due to the proximity of a fault location to an application location or when the intensity of the reflected signal is weak and thus falls outside of a prescribed fault diagnosis range due to remoteness of the fault location from the application location, a correction location, at which a correlation function value has a global maximum, is derived on the basis of a prescribed correlation function for an application signal applied to a cable to be inspected and an acquired reflected signal, a correction signal, which is a reflected signal from which the application signal is removed at the derived correction location, is calculated, the distance between the correction location and the acquisition location is derived on the basis of a time delay, which is calculated on the basis of the calculated correction signal and the reflected signal at the acquisition location, and a propagation velocity, and therefore, even when the application signal and the reflected signal overlap due to the proximity of the fault location to the application (Continued)

location, the fault type and the fault location of the cable to be inspected may be accurately detected, and even when the intensity of the reflected signal is weak due to remoteness of the fault location from the application location or due to a minute fault level, accuracy and reliability of the fault type determination and the fault location detection for the cable to be inspected may be improved.

7 Claims, 5 Drawing Sheets

(56) References Cited

U.S. PATENT DOCUMENTS

| | | |
|---|---|---|
| 8,324,906 B2 | 12/2012 | Ahamed et al. |
| 2002/0089335 A1 | 7/2002 | Williams |
| 2006/0097730 A1* | 5/2006 | Park .................... G01R 31/088 324/534 |
| 2011/0227582 A1* | 9/2011 | Ahamed ................ G01R 31/11 324/533 |

* cited by examiner

CABLE FAULT DIAGNOSIS METHOD AND SYSTEM

TECHNICAL FIELD

The present invention generally relates to a cable fault diagnosis method and system, and, more particularly, to a method and system capable of detecting a fault type and a fault location of a cable to be diagnosed on the basis of a correction signal, from which an application signal has been removed, and a reflected signal, when the application signal and the reflected signal overlap each other due to the proximity of a fault location to an application location or when the intensity of the reflected signal is weak and thus falls out of a fault diagnosis range due to remoteness of the fault location from the application location, in detecting the cable fault type and the fault location on the basis of the application signal, applied to a cable to be diagnosed, and the reflected signal acquired therefrom.

BACKGROUND ART

It has recently become known that a main cause of plane crashes due to technical problems in the aircraft is merely the breakdown of insulation of electrical wirings. Moreover, demand for the systems such as control systems for nuclear power plants, spaceships, submarines, or industrial control equipment, which require high stability in an electrical wiring, are is increasing, the diagnosis and evaluation of the reliability of the electrical wiring are becoming important activities.

In addition, precise diagnosis to determine whether there is an abnormality in a conducting wire and to determine the location thereof are important technical issues at a site for producing various kinds of wires in order to evaluate the quality and consistency of the produced wires.

Accordingly, so far, such a precise diagnosing and location measuring technique, namely, an electrical wiring diagnosis system, mainly adopts reflectometry to diagnose whether there is an abnormality in a wire by transmitting a certain signal to the wire and then measuring the reflected signal.

Reflectometry is performed only in the time domain or in the frequency domain. In reflectometry, a certain application signal is transmitted to the wire, a reflected signal, which has been reflected and returned, is measured, and then whether there is a fault, such as an open circuit, a short circuit, or a discontinuity, is determined, as well as the fault location or characteristic impedance of the wire. There are various kinds of reflectometry, including time-domain reflectometry, standing-wave reflectometry, and frequency-domain reflectometry.

However, in diagnosing a fault location and type of cable by analyzing the reflected signal for such an application signal in the time or frequency domain, restrictions have occurred which include the case where the application signal and the reflected signal overlap each other due to the proximity of a fault location to an application location, the case where the intensity of the reflected signal is weak, thus causing a distance measurement error due to the remoteness of the fault location from the application location, or the case where the accuracy of coupling distance measurement is lowered to cause degradation in the accuracy and reliability of cable diagnosis results.

Accordingly, the present invention proposes a measure for detecting a fault type and a fault location of a cable to be diagnosed on the basis of a correction signal, from which an application signal is removed, and a reflected signal.

DISCLOSURE

Technical Problem

Accordingly, the present invention has been made keeping in mind the above problems occurring in the conventional art, and an object of the present invention is to provide a cable fault diagnosis method and system which derives a correction location on the basis of a prescribed correlation function for an application signal applied to a cable to be inspected and an acquired reflected signal and derives the distance between the correction location and the acquisition location on the basis of a correction signal, from which the application signal is removed, at the derived correction location and the reflected signal at the acquisition location, when the application signal and the reflected signal overlap each other due to the proximity of a fault location to an application location or when the intensity of the reflected signal is weak and thus falls outside of a fault diagnosis range due to the remoteness of the fault location from the application location, in detecting the cable fault type and the fault location on the basis of the application signal applied to a cable to be inspected and the reflected signal acquired therefrom, thereby fundamentally improving the accuracy and reliability of determination of the fault type and fault location of a cable to be inspected.

Technical Solution

In order to accomplish the above object, an aspect of the present invention provides a cable fault diagnosis system including: an application signal generating unit, configured to generate an application signal to which a prescribed Gaussian-enveloped linear chirp signal is reflected through reflectometry selected from among various kinds of reflectometry and to apply the application signal to a cable to be inspected; a reflected signal receiving unit, configured to receive a reflected signal acquired from the cable to be inspected; and a calculating unit, configured to derive an abnormality occurrence location and a state of abnormality of the cable to be inspected through time-domain-analysis of the application signal from the application signal generating unit and the reflected signal, wherein the calculating unit derives a correction location, at which a function value derived from a prescribed correlation function has a global maximum for the application signal and the reflected signal, when the application signal and the reflected signal overlap due to the proximity of a fault location to an application location or when the intensity of the reflected signal is weak and thus falls outside of a prescribed fault diagnosis range due to the remoteness of the fault location from the application location, generates a correction signal, in which an application signal at the correction location is removed from the acquired reflected signal, and derives a time delay value between the correction location of the correction signal and the reflection location of the reflected signal using a prescribed correlation function for the generated correction signal and the reflected signal and then derives the distance between the correction location and the acquisition location on the basis of the derived time delay value and the propagation velocity.

The reflectometry may be one of Sequence Time Domain Reflectometry (STDR) and Spread Spectrum Time Domain Reflectometry (SSTDR).

The calculating unit may include: a time correlation module, configured to derive the correction location at which a function value derived from the correlation function of the application signal and the reflected signal has the global maximum and to generate the correction signal on the basis of a reflected signal from which the application signal at the correction location is removed; and a calculating module, configured to derive the time delay value on the basis of the correction signal generated in the time correlation module and the reflected signal, and to derive the distance between the correction location and the acquisition location on the basis of the time delay value and the propagation velocity to thus determine the abnormality occurrence location and the state of abnormality of the cable to be inspected.

The time correlation module may include: a first time correlator, configured to derive the correction location at which the prescribed correlation function value has the global maximum on the basis of the application signal and the reflected signal; and a second time correlator, configured to generate a correction signal on the basis of a reflected signal, from which the application signal is removed, at the correction location.

The first time correlator may be provided to calculate a correlation function value in the time domain for the application signal, the correlation function value being generated on the basis of a Gaussian-enveloped linear chirp signal, generated from the application signal generating unit, and the reflected signal, and to derive the correction location at which the calculated correlation function value has the global maximum.

The second time correlator may be provided to generate a correction signal, which is a reflected signal from which the application signal at the correction location is removed, on the basis of the difference between the application signal and the reflected signal at the correction location.

The calculating module may be provided to derive a location of occurrence of a cable fault and a fault diagnosis result on the basis of the correction signal and the reflected signal, a correlation function in a time domain for the correction signal and the reflected signal, and the propagation velocity.

In order to accomplish the above object, another aspect of the present invention provides a calculating apparatus of a cable fault diagnosis system. The calculating apparatus includes: a time correlation module, configured to derive a correction location, at which a prescribed correlation function has a global maximum, the correlation function being prescribed for an application signal, to which a Gaussian-enveloped linear chirp signal, prescribed through a reflectometry selected from among various kinds of reflectometry, is reflected, and an reflected signal, and to generate the correction signal on the basis of an application signal at the correction location and an acquired reflected signal; and a calculating module configured to derive a time delay value on the basis of the correction signal generated in the time correlation module and the reflected signal, and to derive an abnormality occurrence location and a state of abnormality of the cable on the basis of the time delay value and a propagation velocity.

The time correlation module may include: a first time correlator, configured to derive a correlation function value in a time domain for the application signal, generated from the application signal generating unit and the reflected signal, and to derive a correction location, at which the derived correlation function value has the global maximum; and a second time correlator, configured to generate a correction signal, which is a reflected signal from which the application signal at the correction location is removed, on the basis of the difference between the application signal at the correction location and the reflected signal.

The calculating module may be provided to derive the location of occurrence of a cable fault and a fault diagnosis result on the basis of the correction signal and the reflected signal, the prescribed correlation function for the correction signal and the reflected signal, and the propagation velocity.

In order to accomplish the above object, another aspect of the present invention provides a cable fault diagnosis method including: generating an application signal, to which a Gaussian-enveloped linear chirp signal prescribed through reflectometry, selected from among various kinds of reflectometry is reflected, to provide the application signal to a cable to be inspected; receiving a reflected signal acquired from the cable to be inspected; and calculating to derive a correction location at which a prescribed correlation function for the application signal and the reflected signal has a global maximum, generate a correction signal, which is a reflected signal from which an application signal at the derived correction location is removed, and derive a cable fault location and a fault type on the basis of the generated correction signal and the reflected signal, when the application signal and the reflected signal overlap due to the proximity of a fault location to an application location or when the intensity of the reflected signal is weak and thus falls outside of a prescribed fault diagnosis range due to remoteness of the fault location from the application location.

The reflectometry may be one of STDR and SSTDR.

The calculating may include deriving a correlation function value in the time domain for an application signal generated from a chirp signal, generated from the application signal generating unit, and a reflected signal, and deriving the correction location at which the derived correlation function has the global maximum; generating a correction signal, which is a reflected signal from which an application signal at the correction location is removed, on the basis of the difference between the application signal at the correction location and the reflected signal; and deriving the location of occurrence of the cable fault and the fault diagnosis result on the basis of the correction signal and the reflected signal, a correlation function value defined for the correction signal and the reflected signal, and a propagation velocity.

Advantageous Effects

According to the present invention, when an application signal and a reflected signal overlap each other due to the proximity of a fault location to the application location or when the intensity of the reflected signal is weak and thus falls outside of a prescribed fault diagnosis range due to remoteness of the fault location from the application location, a correction location, at which a correlation function value has a global maximum, is derived on the basis of a prescribed correlation function for an application signal, to which a Gaussian-enveloped linear chirp signal prescribed through reflectometry selected from various kinds of reflectometry, is reflected and an acquired reflected signal, a correction signal is calculated, the correction signal being a reflected signal from which the application signal is removed at the derived correction location, the distance between the correction location and the acquisition location is derived on the basis of a time delay, which is calculated on the basis of the calculated correction signal and the reflected signal at the acquisition location, and a propagation velocity. Accordingly, even when the application signal and the reflected signal overlap each other due to the proximity of the fault location to the application location, the fault type and the fault location of the cable to be inspected may be accurately detected. In addition, even when the intensity of the reflected signal is weak due to the remoteness of the fault location from the application location or due to a minute fault level, the accuracy and reliability of the fault type and the fault location detection for the cable to be inspected may be improved.

DESCRIPTION OF DRAWINGS

The accompanying drawings illustrate the embodiments of the present invention and are included to provide a further understanding of the spirit of the present invention together with the detailed description of the invention, and accordingly, the present invention should not be limitedly interpreted based on the matters shown in the drawings.

BEST MODE

Hereinafter, a cable fault diagnosis system and method according to the present invention will be described in detail with reference to the accompanying drawings. The thicknesses of lines and sizes of elements in the drawings may be exaggerated for clarity and convenience of explanation. In addition, terms used throughout the present specification are defined in consideration of functions in the present invention, and thus may be different depending upon user's and operator's intentions or practices. Therefore, the terms may be defined based on descriptions made throughout the example embodiments.

Reference now should be made to the drawings, in which the same reference numerals are used throughout the different drawings to designate the same or similar components.

Figure 1:
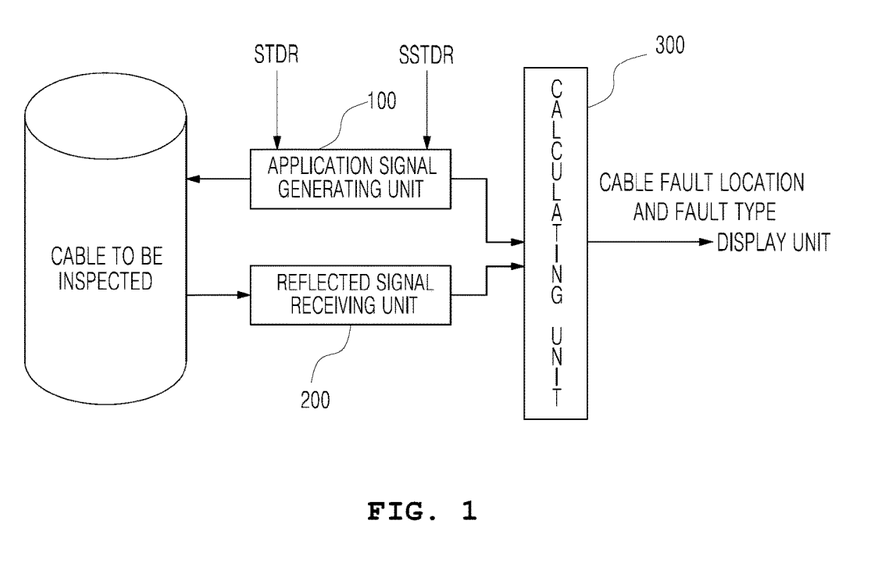
FIG. 1 illustrates the configuration of a cable fault diagnosis system according to an embodiment of the present invention.
Figure 2:
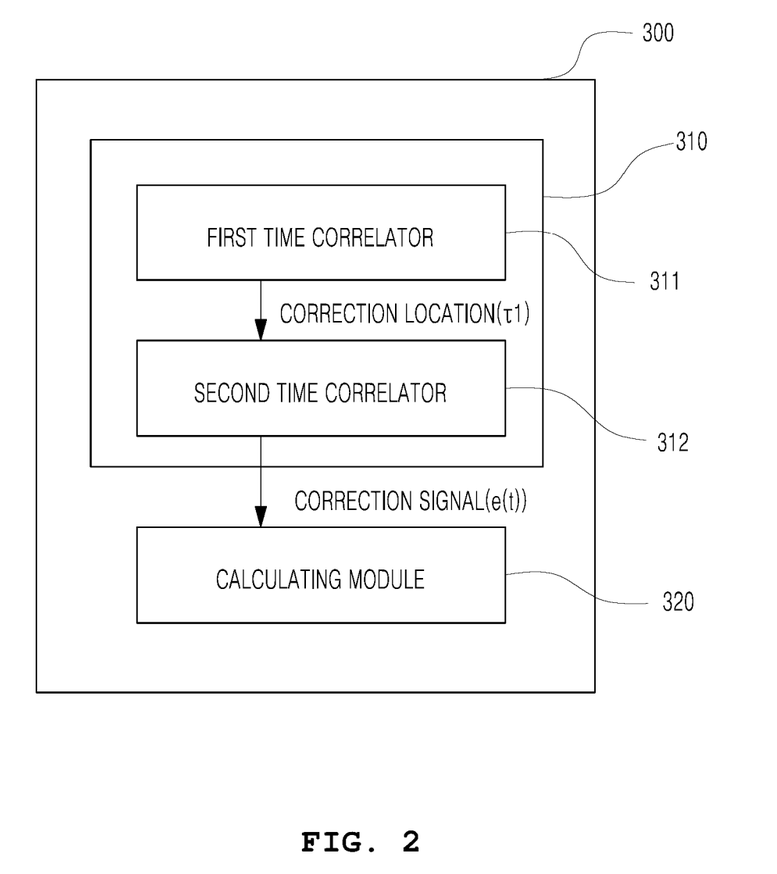
FIG. 2 illustrates the configuration of a calculating unit of a cable fault diagnosis system according to an embodiment of the present invention.

FIG. 1 illustrates a cable fault diagnosis system according to an embodiment of the present invention and FIG. 2 illustrates the configuration of the calculating unit illustrated in FIG. 1. The cable fault diagnosis system according to the embodiment of the present invention will be described with reference to FIGS. 1 and 2.

As illustrated in FIGS. 1 and 2, the cable fault diagnosis system according to an embodiment of the present invention is configured to provide an application signal s(t) to a cable to be inspected, acquire a reflected signal after the application signal s(t) propagates through the cable, analyze time information for the acquired reflected signal, and diagnoses a fault location and the type of the cable to be inspected, where the frequency of the application signal s(t) linearly increases according to time, like a Gaussian-enveloped linear chirp signal $p_{Tc}(t)$ generated using reflectometry selected from between sequence time reflectometry (STDR), for observing phases of an application signal at an application location and a reflected signal acquired at an acquisition location to determine the fault location and the type of the cable, and spread spectrum time reflectometry (SSTDR), for applying a signal, a band of which is spread using a sequence having excellent self-correlation performance and is then phase-shift-keying-modulated, and observing the phase of an acquisition signal which has been reflected and returned from the fault location to detect the fault location and fault type.

At this point, when the application signal propagates in the cable to be inspected, the amplitude thereof is attenuated and the phase thereof is distorted depending on the cable characteristics. At this point, the degree of amplitude attenuation and the degree of phase distortion of the application signal depend on the frequency of the signal and the distance, and the propagation factor of the cable is reflected thereto.

A cable fault diagnosis system according to an embodiment of the present invention is provided to derive a correction location, at which a prescribed correlation function for an application signal and a reflected signal has a global maximum, calculate a correction signal, which is a reflected signal from which an application signal is removed at the derived correction location, and to derive the fault location and the fault type of a cable to be inspected on the basis of the calculated correction signal and the reflected signal, when the application signal and the reflected signal overlap each other due to the proximity of the fault location to the application location or when the intensity of the reflected signal is weak and thus falls outside of a prescribed fault diagnosis range due to remoteness of the fault location from the application location. The system includes an application signal generating unit 100, a reflected signal receiving unit 200, and a calculating unit 300.

Here, the application signal generating unit 100 generates an application signal s(t) on the basis of a chirp signal, the frequency of which linearly changes over time, generated using reflectometry selected from between STDR and SSTDR.

Parameters of the application signal s(t) are generated through General Purpose Interface Bus (GPIB) programming of a device control program means. Here, a sequence of processes at the application signal generating unit 100 for generating and localizing a chirp signal through the GPIB programming is typically identical or similar to a sequence of processes for generating an arbitrary waveform.

In addition, the generation of the application signal s(t) is performed along the conducting wire of the cable to be inspected, and when the fault location of the cable to be inspected is reached, a portion of the application signal s(t) is transmitted and the remaining portion of the application signal s(t) is reflected according to a reflection coefficient.

At this point, the calculating unit 300 is provided to determine whether there is a fault in the cable to be inspected by considering a time delay value ID, which is the time difference between the location of application of the application signal s(t) and the location of acquisition of a reflected signal r(t). For example, if the time delay value TD is large, it may be determined that a fault exists in the cable.

The calculating unit 300 derives the time delay value $\tau_D$ on the basis of the value from a prescribed correlation function $R_{ST}(\tau)$ for the received application signal s(t) and the reflected signal r(t), and derives the distance d between the application location and the acquisition location on the basis of a predefined propagation velocity $v_P$. The correlation function $R_{ST}(\tau)$ and distance d satisfy the following Equations (1) and (2).

$$R_{ST}(\tau) = \frac{1}{NT_c} \int_0^{NT_c} S(t)r^*(t+\tau)d\tau \quad (1)$$

$$d = \frac{v_p \times \tau_D}{2} \quad (2)$$

Here, when STDR, for observing phases at the application location and the acquisition location to determine a fault location and a fault type, is adopted, the application signal s(t), which uses an N binary sequence $c=[c_0, c_1, \ldots, c_{N-1}]$, satisfies the following Equation (3).

$$s(t) = \sum_{n=0}^{N-1} c_n p_{Tc}(t - nT_c) \quad (3)$$

$$p_{Tc}(t) = \begin{cases} 1, & 0 \leq t < T_c \\ 0, & \text{otherwise} \end{cases}$$

On the other hand, when SSTDR for applying a signal, the band of which is spread using a sequence having excellent self-correlation performance and is then phase-shift-keying-modulated, and for observing the phase of an acquisition signal, which has been reflected and returned from a fault location, to detect the fault location and the fault type, is used, the application signal s(t), which uses an N binary sequence $c=[c_0, c_1, \ldots, c_{N-1}]$, $c_i \in \{-1,1\}$, satisfies the following Equation (4).

$$s(t) = \sum_{n=0}^{N-1} c_n p_{Tc}(t - nT_c) \quad (4)$$

$$p_{Tc}(t) = \begin{cases} \cos(2\pi f_c t), & 0 \leq t < T_c \\ 0, & \text{otherwise} \end{cases}$$

In addition, the calculating unit 300 is provided to derive a correction location ($\tau_1$), at which the value of the prescribed correlation function $R_{ST}(\tau)$ has a global maximum for the predefined application signal s(t) and the reflected signal r(t), to calculate a correction signal e(t), which is a reflected signal from which an application signal $s(t-\tau_1)$ at the derived correction location $\tau_1$ is removed, and to derive the fault location and type of the cable to be inspected on the basis of the calculated correction signal e(t) and the reflected signal r(t).

In other words, as illustrated in FIG. 2, the calculating unit 300 further includes a time correlation module 310 for deriving the correction location $\tau_1$, at which a global maximum is resulted, from the correlation function $R_{ST}(\tau)$ of the application signal s(t) and the reflected signal r(t), and for generating the correction signal e(t) on the basis of the application signal $s(t-\tau_1)$ and the acquired reflected signal r(t) at the correction location $\tau_1$, and a calculating module 320 for deriving the time delay value $\tau_D$ on the basis of the correction signal e(t) generated in the time correlation module 310 and the reflected signal r(t) to derive the abnormality occurrence location and the state of abnormality of the cable.

The time correlation module 310 includes a first time correlator 321, for deriving the correction location at which the predefined correlation function has a global maximum on the basis of the application signal and the reflected signal, and a second time correlator 322, for generating a correction signal on the basis of an application signal and the acquired reflected signal at the correction location.

Here, the correction signal is a reflected signal from which an application signal at the correction location is removed.

The first time correlator 321 derives a correction location $\tau_1$, at which a correlation function has a global maximum on the basis of a time domain correlation function $R_{ST}(\tau)$ for the application signal, generated from the application signal generating unit 100, and the reflected signal, and the derived correction location $\tau_1$ is delivered to the second time correlator 322.

In addition, the second time correlator 322 generates the correction signal e(t) on the basis of the difference between the application signal s(t) and the reflected signal r(t) at the correction location $\tau_1$, and the correction signal e(t) satisfies the following Equation (6).

$$e(t)=r(t)-s(t-\tau_1) \quad (6)$$

The correction signal e(t) is then delivered to the calculating module 330.

The calculating module 330 derives, from Equation (1), an acquisition location $\tau_2$ at which the correlation function $R_{ST}(\tau)$ for the correction signal e(t) and the reflected signal r(t) has a global maximum and derives a time delay value $\tau_p$ on the basis of the difference between the derived acquisition location $\tau_2$ and the correction location $\tau_1$.

In addition, the calculating module 330 derives, from Equation (2), the distance d between the correction location $\tau_1$ and the acquisition location $\tau_2$ on the basis of the time delay value $\tau_p$ and the prescribed propagation velocity $v_P$.

Here, the sequence of processes for deriving the distance d between the correction location $\tau_1$ and the acquisition location $\tau_2$ on the basis of the correction signal e(t) and the reflected signal r(t) is identical or similar to STDR, for observing phases at an application location and an acquisition location to determine the fault location and the fault type, and SSTDR, for applying a signal, the band of which is spread using a sequence having excellent self-correlation performance and then phase-shift-keying-modulated, and for observing the phase of an acquisition signal reflected and returned at a fault location to detect the fault location and the fault type.

Figure 3:
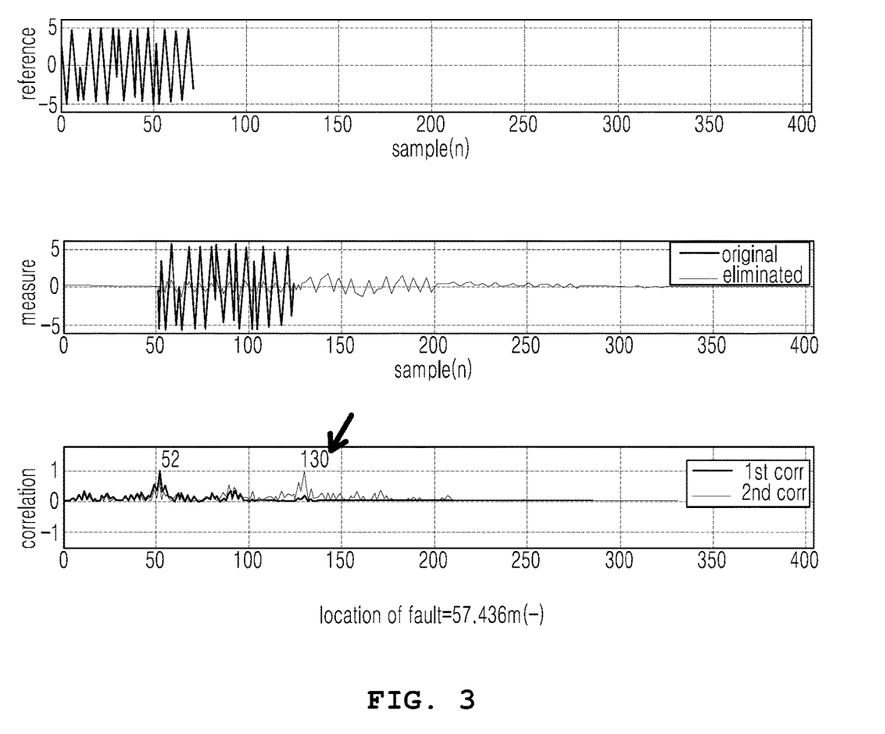
FIG. 3 shows output waveforms of the calculating unit of a cable fault diagnosis system according to an embodiment of the present invention.

FIG. 3(a) is a waveform of an application signal, FIG. 3(b) is a waveform of a correction signal from which an application signal at a correction location is removed, and FIG. 3(c) is a waveform showing a time-delayed state derived on the basis of the correction signal and the reflected signal. As illustrated, it may be seen that the distance between the correction location and the acquisition location of the reflected signal is 57.436 m.

Figure 4:
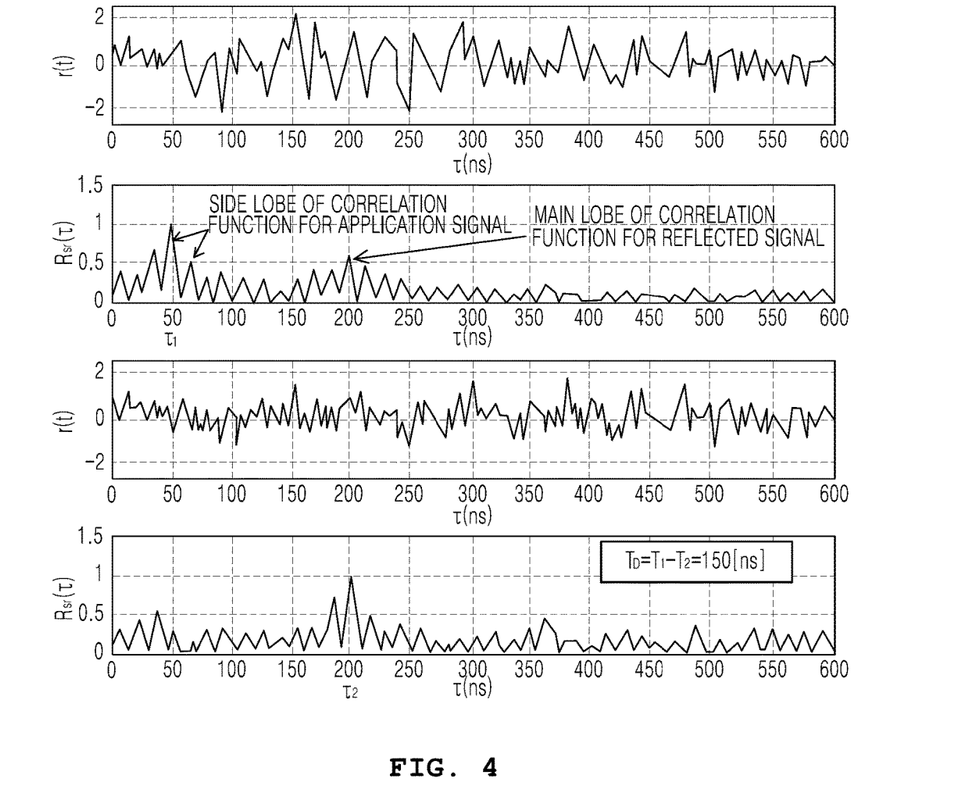
FIG. 4 shows waveforms of signals of a cable fault diagnosis system to which an embodiment of the present invention is applied.

FIG. 4 shows waveforms in the case where the application signal is an m sequence, of which the magnitude is 1 and the length is 7, and there is one reflected signal of which the dispersion of Gaussian noise is 0.25 and the magnitude is reduced to half.

As illustrated, since the global maximum of the correlation function is not the main lobe of the correlation function for the reflected signal but a side lobe of the correlation function for the application signal, the location of the reflected signal may not be known. However, since the correction location ii of the global maximum of the correlation function of the application signal and the reflected signal is 50 [ns] and the acquisition location $\tau_2$ of the global maximum of the correlation function of the application signal and the reflected signal is 200 [ns], the time delay value $\tau_p$, which is the difference between the correction location $\tau_1$ of the correction signal and the acquisition location $\tau_2$ of the reflected signal, is derived to be 150 [ns].

On the basis of such a time delay value $\tau_p$ and a propagation velocity, the distance d between the correction location and the acquisition location may be derived, and accordingly, the fault location and the fault type may be extracted.

In other words, a correction location, at which a correlation function value has a global maximum, is derived on the basis of a correlation function prescribed for an application signal applied to a cable to be inspected and an acquired reflected signal, a correction signal is calculated, which is a reflected signal from which the application signal is removed at the derived correction location, and the distance between the correction location and the acquisition location is derived on the basis of a time delay, which is calculated on the basis of the calculated correction signal and a reflected signal at the acquisition location, and a propagation velocity. Accordingly, even when the application signal and the reflected signal overlap each other due to the proximity of the fault location to the application location, the fault type and fault location of the cable to be inspected may be accurately detected. In addition, even when the intensity of the reflected signal is weak due to the remoteness of the fault location from the application location or due to a minute fault level, the accuracy and reliability of the fault type and fault location detection for the cable to be inspected may be improved.

A sequence of processes will be described with reference to FIG. 5, in which a fault location and a fault type of a cable to be inspected are detected on the basis of a derived distance between a derived correction location and an acquisition location by deriving the correction location, at which a correlation function value has a global maximum, on the basis of a prescribed correlation function for an application signal applied to the cable to be inspected and an acquired reflected signal, calculating a correction signal, which is a reflected signal from which the application signal is removed at the derived correction location, and deriving the distance between the correction location and the acquisition location on the basis of a time delay value, which is calculated on the basis of the calculated correction signal and a reflected signal at the acquisition location, and a propagation velocity, when the application signal and the reflected signal overlap each other due to the proximity of the fault location to the application location or when the intensity of the reflected signal is weak and thus falls outside of a prescribed fault diagnosis range due to remoteness of the fault location from the application location.

Figure 5:
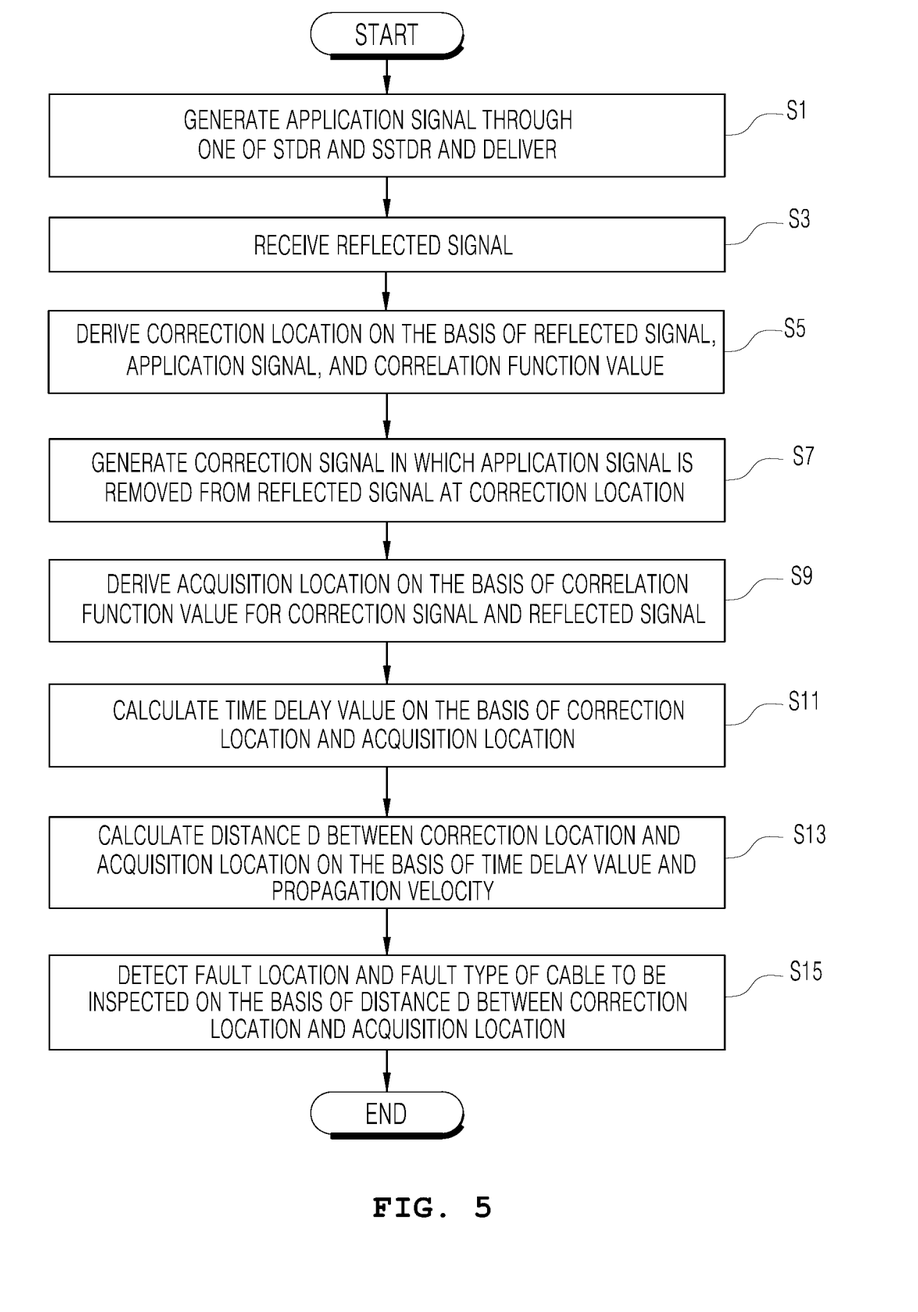
FIG. 5 is a flowchart illustrating a cable fault diagnosis process of another embodiment of the present invention.

FIG. 5 is a flowchart of an operation process of the calculating unit illustrated in FIG. 2, and a cable fault diagnosis process according to another embodiment of the present invention will be described with reference to FIGS. 1, 2 and 5.

Firstly, the application signal generating unit 100 generates an application signal s(t), of which the frequency increases linearly over time and which includes a Gaussian-enveloped linear chirp signal $p_{Tc}(t)$ selected according to one kind of reflectometry selected from among STDR and SSTDR, and applies the application signal s(t) to the cable to be inspected (Step S1). At this point, the application signal is generated using the reflectometry selected from among STDR and SSTDR.

Then, the reflected signal receiving unit 200 receives a reflected signal r(t) acquired from the cable to be inspected after the application signal s(t) is propagated (Step S3).

In addition, the time correlation module 310 of the calculating unit 300 derives the correction location $\tau_1$, at which the function value of the prescribed correlation function $R_{ST}(\tau)$ has a global maximum for the application signal s(t) and the reflected signal r(t), and calculates the correction signal e(t), which is a reflected signal from which the application signal s(t-$\tau_1$) is removed at the derived correction location $\tau_1$ (step S5).

In other words, the correction signal e(t) is derived as the reflected signal r(t)—the application signal s(t-$\tau_1$) at the correction location $\tau_1$ (step S7).

In addition, a calculating module 320 of the calculating unit 300 derives the acquisition location $\tau_2$, at which a function value is a global maximum, on the basis of a prescribed correlation function for the correction signal e(t) and the reflected signal r(t), and derives a time delay value TD for the correction location of the derived correction signal and the acquisition location $\tau_2$ of the reflected signal (steps S9 and S11).

The calculating module 320 derives the distance d between the correction location and the acquisition location on the basis of the time delay value TD and the propagation velocity $v_P$, and detects the fault location and the fault type of the cable to be inspected on the basis of the derived distance d (steps S13 and S15).

According to an embodiment of the present invention, when an application signal and a reflected signal overlap each other due to the proximity of a fault location to the application location or when the intensity of the reflected signal is weak and thus falls outside of a prescribed fault diagnosis range due to remoteness of the fault location from the application location, a correction location, at which a correlation function value has a global maximum, is derived on the basis of a prescribed correlation function for an application signal applied to a cable to be inspected and an acquired reflected signal, a correction signal is calculated, the correction signal being a reflected signal from which the application signal is removed at the derived correction location, the distance between the correction location and the acquisition location is derived on the basis of a time delay, which is calculated on the basis of the calculated correction signal and the reflected signal at the acquisition location, and a propagation velocity. Accordingly, even when the application signal and the reflected signal overlap each other due to the proximity of the fault location to the application location, the fault type and the fault location of the cable to be inspected may be accurately detected. In addition, even when the intensity of the reflected signal is weak due to remoteness of the fault location from the application location or due to a minute fault level, the accuracy and reliability of the fault type determination and the fault location detection for the cable to be inspected may be improved.

Steps of the method or the algorithm which has been described in regard to the embodiments of the present invention proposed herein are realized in the form of program instructions executable through various computer means and are recordable in a computer-readable medium. The computer-readable recording medium may include program instructions, data files, and data structures, alone or in combination. The program instructions of the medium may be designed and configured specifically for the present invention, or may be a type that is known and readily available to those skilled in the computer software field. Examples of the computer-readable recording medium include a magnetic medium such as a hard disk, floppy disk, and magnetic tape, an optical recording medium such as a CD-ROM and DVD, magneto-optical media such as a floptical disk, and a hardware device particularly configured to store and execute the program instructions, such as ROM, RAM, and flash memory. A program instruction may include high-level language code executable by a computer using an interpreter in addition to machine code created by a compiler. The hardware device may be configured to operate as at least one software module to perform an operation of various embodiments and vice versa.

Therefore, it should be understood that since the configurations of the embodiments and drawings described herein are merely exemplary embodiments of the present invention, it will be readily understood by those skilled in the art that various modifications and changes can be made thereto without departing from the spirit and scope of the present invention defined by the appended claims and their equivalents.

INDUSTRIAL APPLICABILITY

When an application signal and a reflected signal overlap due to the proximity of a fault location to the application location or when the intensity of the reflected signal is weak and thus falls outside of a prescribed fault diagnosis range due to remoteness of the fault location from the application location, a correction location, at which a correlation function value has a global maximum, is derived on the basis of a prescribed correlation function for an application signal applied to a cable to be inspected and an acquired reflected signal, a correction signal, which is a reflected signal from which the application signal is removed at the derived correction location, is calculated, the distance between the correction location and the acquisition location is derived on the basis of a time delay, which is calculated on the basis of the calculated correction signal and the reflected signal at the acquisition location, and a propagation velocity. Accordingly, even when the application signal and the reflected signal overlap each other due to the proximity of the fault location to the application location, the fault type and the fault location of the cable to be inspected may be accurately detected. In addition, even when the intensity of the reflected signal is weak due to remoteness of the fault location from the application location or due to a minute fault level, the accuracy and reliability of the fault type determination and the fault location detection for the cable to be inspected may be improved. Therefore, the present invention may improve a cable fault diagnosis system and method in terms of operational accuracy and reliability, and furthermore, from the aspects of performance and efficiency. In addition, since an electrical wiring system is sufficiently sellable or tradable for geology/mineral resource exploration, material surface inspection, radar/sonar, communication network wirings, optical cable diagnosis, remote sensing, leakage diagnosis of a fluid guiding tube, or level measurement, etc., and is apparently practicable, the present invention has industrial applicability.

What is claimed is:
1. A cable fault diagnosis system comprising:
    an application signal generating unit configured to generate an application signal (S(t)) to which a prescribed Gaussian-enveloped linear chirp signal is reflected, and to apply the application signal (S(t)) to a cable to be inspected;
    a reflected signal receiving unit configured to receive a reflected signal (r(t)) of the application signal (S(t)) reflected from the cable; and
    a calculating unit configured to find a fault location and a fault type out of the cable using time-domain-analysis, wherein:
        the application signal generating unit applies the application signal (S(t)) to the cable;
        the reflected signal receiving unit receives the reflected signal (r(t)) of the application signal reflected from the cable;
        the calculating unit calculates a predetermined correlation function of the application signal (S(t)) and the reflected signal (r(t)) and obtains a first time (t1) at which the predetermined correlation function of the application signal and the reflected signal has a global maximum;
        the calculating unit calculates a correction signal (e(t)) by removing a delayed application signal (S(t−t1)) from the reflected signal (r(t)), wherein the delayed application signal (S(t−t1)) corresponds to the application signal (S(t)) with a time delay t1;
        the calculating unit calculates the predetermined correlation function of the correction signal (e(t)) and the reflected signal (r(t)) and obtains a second time (t2) at which the predetermined correlation function of the correction signal (e(t)) and the reflected signal (r(t)) has a global maximum; and
        the calculating unit calculates a time difference (td) between the second time (t2) and the first time (t1), and finds the fault location and the fault type using the time difference (td).

2. The cable fault diagnosis system of claim 1, wherein the system uses a reflectometry selected one of Sequence Time Domain Reflectometry (STDR) and Spread Spectrum Time Domain Reflectometry (SSTDR).

3. The cable fault diagnosis system of claim 1, wherein the calculating unit comprises:
    a time correlation module configured to find the first time (t1) and a correction location corresponding to the first time (t1), and calculate the correction signal; and
    a calculating module configured to find the second time (t2), calculate the time difference, and find the fault location and the fault type based on the time difference.

4. The cable fault diagnosis system of claim 3, wherein the time correlation module comprises:
    a first time correlator configured to derive the correction location; and
    a second time correlator configured to generate the correction signal.

5. The cable fault diagnosis system of claim 4, wherein the calculating module calculates the fault location by multiplying the time difference (td) by a propagation velocity.

6. A cable fault diagnosis method comprising:
    Generating, by an application signal generating unit, an application signal (S(t)), to which a Gaussian-enveloped linear chirp signal, is reflected;
    applying, by the application signal generating unit, the application signal (S(t)) to a cable to be inspected;
    receiving, by a reflected signal receiving unit, a reflected signal (r(t)) of the application signal reflected from the cable;
    calculating, by a calculating unit, a predetermined correlation function ($R_{ST}(t)$) of the application signal (S(t)) and the reflected signal (r(t)) and obtaining a first time (t1) at which the predetermined correlation function ($R_{ST}(t)$) of the application signal (S(t)) and the reflected signal (r(t)) has a global maximum;

calculating, by a calculating unit, a correction signal (e(t)) by removing a delayed application signal (S(t−t1)) from the reflected signal (r(t)), wherein the delayed application signal (S(t−t1)) corresponds to the application signal (S(t)) with a time delay t1;

calculating, by a calculating unit, the predetermined correlation function ($R_{ST}(t)$) of the correction signal (e(t)) and the reflected signal (r(t)) and obtaining a second time (t2) at which the predetermined correlation function ($R_{ST}(t)$) of the correction signal (e(t)) and the reflected signal (r(t)) has a global maximum; and calculating, by a calculating unit, a time difference (td) between the second time (t2) and the first time (t1), and finding a cable fault location and a fault type using the time difference.

7. The cable fault diagnosis method of claim 6, wherein the method uses a reflectometry selected one of Sequence Time Domain Reflectometry (STDR) and Spread Spectrum Time Domain Reflectometry (SSTDR).

* * * * *